(12) United States Patent
Kim

(10) Patent No.: US 6,525,373 B1
(45) Date of Patent: Feb. 25, 2003

(54) POWER SEMICONDUCTOR DEVICE HAVING TRENCH GATE STRUCTURE AND METHOD FOR MANUFACTURING THE SAME

(75) Inventor: Han-soo Kim, Seoul (KR)

(73) Assignee: Fairchild Korea Semiconductor Ltd., Suwon (KR)

(*) Notice: Subject to any disclaimer, the term of this patent is extended or adjusted under 35 U.S.C. 154(b) by 0 days.

(21) Appl. No.: 09/340,382

(22) Filed: Jun. 28, 1999

(30) Foreign Application Priority Data

Jun. 30, 1998 (KR) .......................... 98-25908

(51) Int. Cl.⁷ .................................... H01L 29/76
(52) U.S. Cl. .............. 257/330; 257/328; 257/329; 438/259; 438/270; 438/271
(58) Field of Search .................. 257/330–332, 257/350, 333, 334, 328, 329, 407, 410, 411, 412, 413; 438/270–271, 259, 589

(56) References Cited

U.S. PATENT DOCUMENTS

| | | | |
|---|---|---|---|
| 5,915,180 A | * | 6/1999 | Hara et al. .................. 438/270 |
| 6,051,468 A | * | 4/2000 | Hshieh ........................ 438/270 |
| 6,091,107 A | * | 7/2000 | Amaratung et al. ........ 257/331 |
| 6,191,432 B1 | * | 2/2001 | Sugiyama et al. ........... 257/19 |

FOREIGN PATENT DOCUMENTS

JP          9-74191          3/1997

* cited by examiner

Primary Examiner—Steven Loke
Assistant Examiner—Donghee Kang
(74) Attorney, Agent, or Firm—Volentine Francos, PLLC

(57) ABSTRACT

A power semiconductor device having a trench gate structure in which it is possible to reduce the number of required masks and to improve its characteristics, and a method for manufacturing the same, includes a semiconductor substrate and a semiconductor region of a first conductive type formed on the semiconductor substrate. A source region of a second conductive type is formed on the semiconductor region. A trench is formed to pass through the source region and the semiconductor region of the first conductive layer. A first conductive layer formed to be insulated from the semiconductor substrate by interposing a gate insulating film, and a gate formed of a second conductive layer surrounded by the first conductive layer are formed in the trench. An interlayer dielectric film is formed on the semiconductor substrate. A gate electrode is formed connected to the gate through a contact hole formed in the interlayer dielectric film. A source electrode is formed connected to the source region through a second contact hole formed in the interlayer dielectric film.

9 Claims, 4 Drawing Sheets

US 6,525,373 B1

POWER SEMICONDUCTOR DEVICE HAVING TRENCH GATE STRUCTURE AND METHOD FOR MANUFACTURING THE SAME

BACKGROUND OF THE INVENTION

1. Field of the Invention

The present invention relates to a power semiconductor device and a method for manufacturing the same, and more particularly, to a power semiconductor device having a trench-type gate and a method for manufacturing the same.

2. Description of the Related Art

Recently, as applied equipment becomes larger and has larger capacity, a power controlling semiconductor device having a high breakdown voltage, a high current capacity, and capable of high-speed switching is necessary. In such a power controlling semiconductor device, the power loss must be very small in a normal operation state. As a system becomes smaller, the power controlling semiconductor device also becomes smaller.

In the past, a double-diffused metal oxide semiconductor field effect transistor (DMOSFET) structure using a planar diffusion technology was generally used as the power controlling semiconductor device. Recently, a MOSFET structure of a trench gate type in which a trench is formed by etching a semiconductor substrate to a predetermined depth and the inside thereof is filled with a gate conductive layer, is sought.

In general, a semiconductor device having the trench type gate has more complicated manufacturing processes and requires one or two more masks than a semiconductor device having the planar structure. In the aspect of cost, it is more advantageous to increase the number of devices integrated in one chip, i.e., the number of net dies. However, since many processing steps and much processing time are required, it is uneconomical to increase the number of the net dies. Therefore, in the case of the MOSFET having the trench type gate or an insulated gate bipolar transistor (IGBT), it is necessary to reduce the number of masks.

FIG. 1 is a sectional view showing a power MOSFET of a conventional trench gate structure.

In FIG. 1, reference numerals 10, 12, 14, 16, 18, 20, 22, 24, and 26 respectively denote a semiconductor substrate 10 doped with high concentration of first conductive type impurities, an epitaxial layer 12, a body region 14 doped with a low concentration of second conductive type impurities, a source region 16, a gate insulating film 18, a trench type gate 20 filled with polysilicon, an interlayer dielectric film 22, a source electrode 24 connected to the source region, and a gate electrode 26 connected with the gate.

In a conventional technology, a gate is formed by forming a trench in a semiconductor substrate and completely filling the inside of the trench with polysilicon. The trench is formed to have a width of 1 $\mu$m in order to facilitate the filling. However, the contact margin must be not more than 0.25 $\mu$m in order to connect the gate formed in the trench to the gate electrode. Therefore, since a very precise processing level is required and the yield is lowered, it is uneconomical with respect to cost. Also, since the roughness of the surface of the polysilicon film filled in the trench is not uniform, it is difficult to stably form a contact to a gate electrode.

In order to solve such problems, in a conventional technology, the contact to a gate electrode 26 is facilitated by leaving the polysilicon film to have a certain thickness on the semiconductor substrate and patterning the polysilicon film using the mask as shown in FIG. 1. However, according to this method, the number of masks increases, thus increasing manufacturing costs.

SUMMARY OF THE INVENTION

To solve the above problems, it is an objective of the present invention to provide a power semiconductor device by which it is possible to save manufacturing expenses by reducing the number of masks.

It is another objective of the present invention to provide a method of manufacturing the above power semiconductor device.

Accordingly, to achieve the first objective, a power semiconductor device of a trench gate structure according to the present invention includes a semiconductor substrate and a semiconductor region of a first conductive type formed on the semiconductor substrate. A source region of a second conductive type is formed on the semiconductor region. A trench is formed to pass through the source region and the semiconductor region of the first conductive layer. A first conductive layer, formed to be insulated from the semiconductor substrate by interposing a gate insulating film, and a gate formed of a second conductive layer surrounded by the first conductive layer are formed in the trench. An interlayer dielectric film is formed on the semiconductor substrate. A gate electrode is formed connected to the gate through a contact hole formed in the interlayer dielectric film. A source electrode is formed connected to the source region through a second contact hole formed in the interlayer dielectric film.

The width of the upper surface of the gate is preferably equal to or less than the width of the trench. The plane structure of the gate is circular or polygonal having at least five sides. In particular, the width of the trench in the part in which the gate contacts a gate electrode is preferably 2 $\mu$m.

The first conductive layer is formed of polysilicon and the second conductive layer is preferably formed of metal.

According to one embodiment, the semiconductor substrate comprises a first region highly doped with second conductive type impurities, and a second conductive region doped with the second conductive type impurities of low concentration.

According to another embodiment, the semiconductor substrate comprises a first region highly doped with first conductive type impurities, a second region highly doped with second conductive type impurities, and a third region formed on the first region and doped with the second conductive type impurities of low concentration.

To achieve the second object, in the method for manufacturing a power semiconductor device of a trench gate structure according to the present invention, a semiconductor region of a first conductive type is formed on a semiconductor substrate. A source region of a second conductive type is formed on the semiconductor region. A trench is formed in a predetermined region of the semiconductor substrate. A gate insulating film is formed on the semiconductor device in which the trench is formed. A gate formed of a first conductive layer, formed to be insulated from the semiconductor substrate by the gate insulating film, and a second conductive layer, surrounded by the first conductive layer, are formed in the trench. An interlayer dielectric film is formed on the semiconductor substrate in which the gate is formed. The source region and the gate are exposed by patterning the interlayer dielectric film. A source electrode and a gate electrode are formed respectively connected to the source region and the gate.

In the step of forming the trench on the semiconductor substrate, the width of the trench at the part where the gate contacts the gate electrode is formed to be about 2 μm. Also, the upper portion of the trench is formed to be circular or polygonal.

The step of forming the gate comprises the steps of sequentially depositing a first conductive layer and a second conductive layer on a semiconductor substrate on which a gate insulating film is formed and planarizing the surfaces of the second conductive layer and the first conductive layer thereby filling the second conductive layer and the first conductive layer in the trench.

The first conductive layer is formed of polysilicon and the second conductive layer is formed of metal.

According to one embodiment, the semiconductor substrate comprises a first region highly doped with second conductive type impurities and a second conductive region doped with the second conductive type impurities of low concentration.

According to another embodiment, the semiconductor substrate comprises a first region highly doped with the first conductive type impurities, a second region highly doped with the second conductive type impurities, and a third region formed on the first region and doped with the second conductive type impurities of low concentration.

According to the present invention, it is possible to omit a mask for patterning a polysilicon film for a gate since it is possible to directly contact the gate to the gate electrode. It is possible to reduce contact resistance and to prevent the characteristics of a device from deteriorating by a thermal process.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
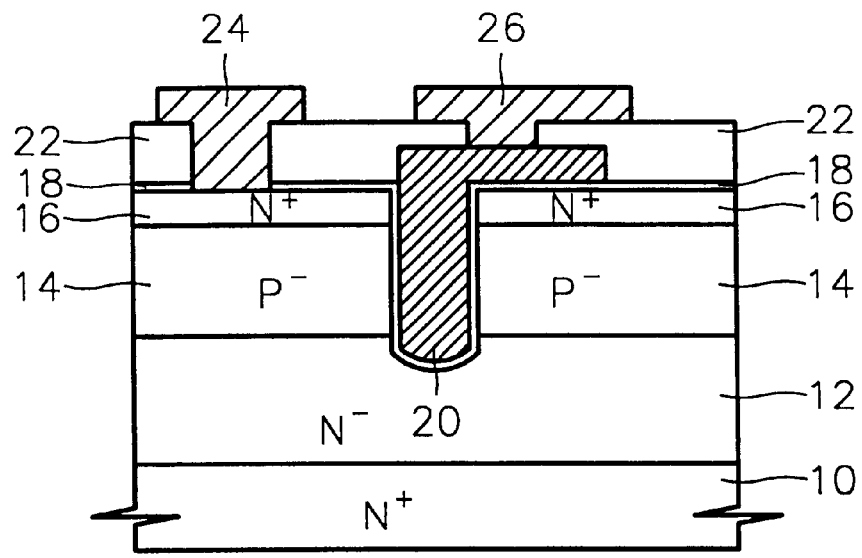
FIG. 1 is a sectional view showing an example of a power semiconductor device of a conventional trench gate structure.

Hereinafter, the present invention will be described in detail with reference to the attached drawings.

Many variations are possible in the following embodiments and the scope of the present invention is not restricted to the following embodiments. The embodiments are provided to more completely describe various aspects of the present invention to anyone skilled in the art. In the drawings the thicknesses of certain layers and regions are exaggerated for the clarity of the specification. The same reference signs denote the same elements. Also, when a certain layer is described to be "on" another layer or another substrate, the certain layer may exist directly on the other layer, or a third layer may be interposed therebetween.

Figure 2:
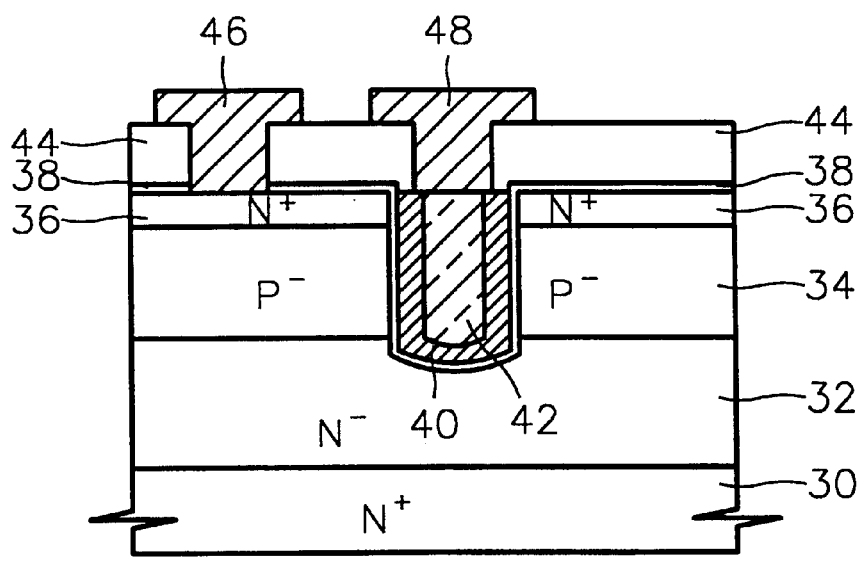
FIG. 2 is a sectional view showing a preferred embodiment of a power semiconductor device of a trench gate structure.

FIG. 2 is a sectional view showing a power semiconductor device of a trench gate structure. A power MOSFET is shown. For ease of explanation in the following description, the first conductive type and second conductive type are N type and P type respectively.

Referring to FIG. 2, a second conductive P$^-$ body region 34 is formed using an N$^+$ semiconductor substrate 30 doped with first conductive type impurities of high concentration, and an epitaxial layer 32 doped with first conductive type impurities of a low concentration, formed on the semiconductor substrate as bottom layers. An N$^+$ source region 36 highly doped with the first conductive type impurities is formed on the P$^-$ body region 34.

A trench is formed so as to extend into some of the N$^-$ epitaxial layer 32 through the N$^+$ source region 36 and the P$^-$ body region 34. A gate insulating film 38 is formed so as to cover inner walls of the trench and the surface of the substrate.

A gate, consisting of a first conductive layer 40 formed so as to be insulated from the semiconductor substrate by the gate insulating film 38 and a second conductive layer 42 surrounded by the first conductive layer 40, is formed in the trench. A gate electrode 48, connected to the gate 40+42 through the contact hole formed in an interlayer dielectric film 44, and a source electrode 46 connected to the source region 36, are formed.

Figure 8:
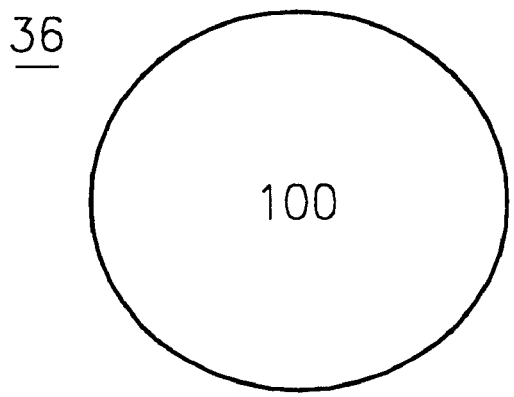
FIGS. 8 and 9 illustrate examples of a trench for containing a gate according to embodiments of the invention.
Figure 9:
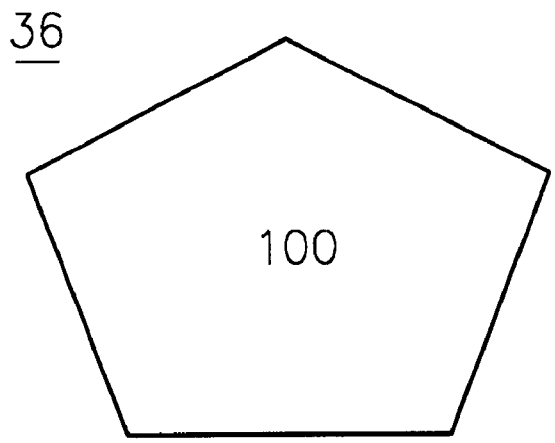

Preferably, the width of the trench where the gate contacts the gate electrode is 2 μm, which is wider than the width of the trench where it is formed in an active region. This is for directly contacting the gate to the gate electrode by widening the alignment margin between the gate and the gate electrode formed in the trench in a process of contacting the gate to the gate electrode. Referring to the top views of FIGS. 8 and 9, the upper portion of the trench 100 is preferably formed to be circular (FIG. 8) or polygonal (more than four sides) (FIG. 9), rather than tetragonal, to facilitate filling the trench with the conductive material for the gate.

The first conductive layer 40 is formed of a polysilicon. The second conductive layer 42 is formed of a metal, such as copper, or polysilicon. Using the metal film, it is possible to lower the contact resistance between the gate and the gate electrode since the metal has a higher conductivity than the polysilicon film and to relatively quickly and completely fill the wide trench since the metal has a higher deposition speed than the polysilicon film.

FIGS. 3 through 6 are sectional views for describing a method of manufacturing a power semiconductor device having a trench gate structure according to an embodiment of the present invention.

Figure 3:
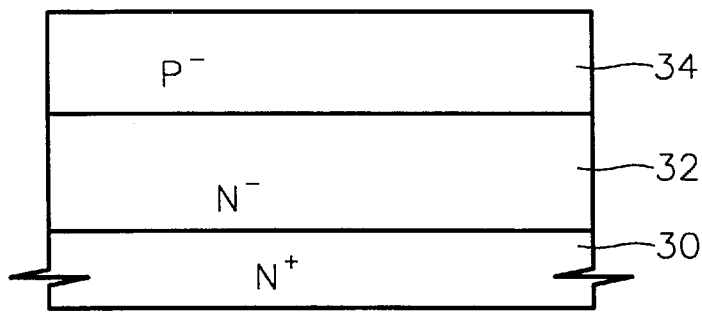
FIGS. 3 through 6 are sectional views showing, in order, processes of a method for manufacturing a power semiconductor device of a trench gate structure according to an embodiment of the present invention.

Referring to FIG. 3, the N$^-$ epitaxial layer 32 of low concentration is formed on the semiconductor substrate 30 highly doped with first conductive type, for example, N type impurities. Then, a thin oxide film (not shown) is formed on the N$^-$ epitaxial layer 32. The oxide film is a buffer layer for relieving stress according to a difference of thermal expansion coefficients between a nitride film for a mask to be formed in the subsequent process and the semiconductor substrate. The oxide film can be omitted, if necessary.

Continuously, a nitride film pattern (not shown) for a mask is formed by depositing an insulating film having etching selectivity, for example a nitride film, on the overall surface of the oxide film (not shown) in a predetermined etching process and patterning the nitride film by a general photolithography process. Then, impurities having opposite conductivity to that of the semiconductor substrate, for example, P type impurities are ion implanted into the N⁻ epitaxial layer 32 with low concentration using the nitride film pattern (not shown) as an ion implantation mask. Continuously, the P⁻ body region is formed in the N⁻ epitaxial layer 32 by diffusing the ion implanted impurities by performing a predetermined thermal process. Then the nitride film is removed.

Figure 4:
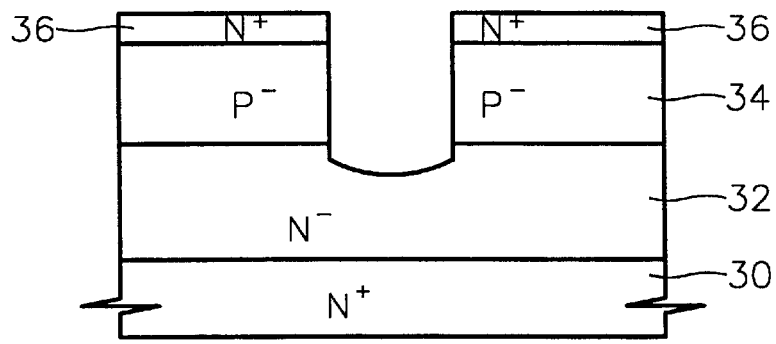

Referring to FIG. 4, the N⁺ source region 36 is formed in the P⁻ body region 34 by performing a general photolithography process and ion implantation process like the method of forming the P⁻ body region. Then, a photoresist pattern (not shown) is formed for opening the region in which the trench will be formed using the general photolithography process.

Then, the trench is formed by etching the N⁻ epitaxial layer 32 in which the N⁺ source region 36 and the P⁻ body region 34 are formed to a predetermined depth using the photoresist pattern as an etching mask.

Preferably, the width of the trench in the portion which will contact the gate electrode is formed to be wider than the width of the trench formed in the active region, for example, about 2 μm. This is for directly contacting the gate formed in the trench in the subsequent process and the gate electrode by widening the alignment margin therebetween. The plane shape of the trench is preferably to be circular or polygonal (more than four sides), rather than tetragonal, in order to facilitate filling the trench with the conductive material for the gate.

Figure 5:
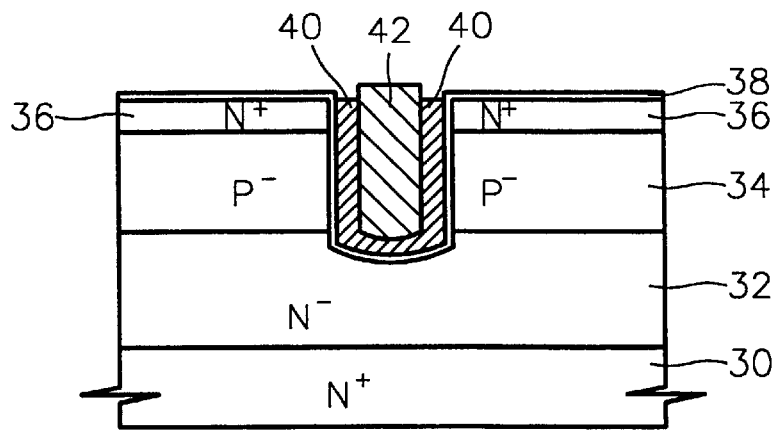

Referring to FIG. 5, a gate insulating film 38 is formed by forming a thin oxide film on the overall surface of the semiconductor substrate in which the trench is formed. Continuously, a polysilicon film 40 and a metal film 42 are sequentially deposited on the overall surface of the semiconductor substrate on which the gate insulating film is formed. Then, the trench is filled with the metal film and the polysilicon film by planarizing the metal film 42 and the polysilicon film 40 using a planarizing process such as an etch back process or chemical mechanical polishing (CMP).

The metal film 42 is formed of a material having a high electric conductivity-higher than the polysilicon film—such as copper. The metal film has an advantage that it is possible to lower the contact resistance with the gate electrode and to relatively quickly and completely fill the wide trench since the deposition speed is high. A polysilicon film can be used instead of the metal film 42.

Also, since the trench is formed to be wide, the processing margin is sufficient even though the gate directly contacts the gate electrode without patterning the polysilicon film 20 (FIG. 1) for the gate residing on the semiconductor substrate, like in the conventional method shown in FIG. 1. Accordingly, it is possible to solve processing problems and to reduce the number of masks.

Figure 6:
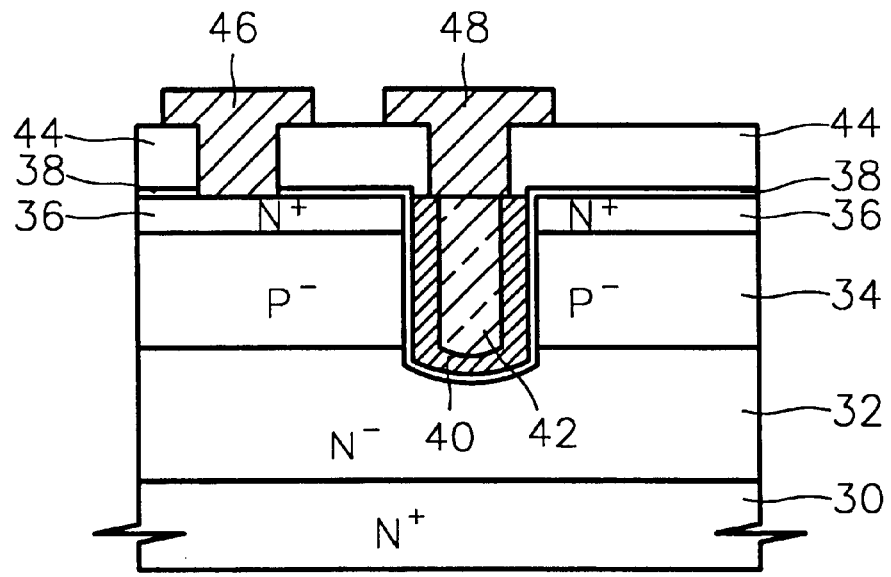

Referring to FIG. 6, an interlayer dielectric film 44 for insulating the transistor from other conductive layers is formed by depositing an insulating film such as phosphorus silicate glass (PSG) or boro-phosphorus silicate glass (BPSG) on the semiconductor substrate in which the gate is formed. Then, a contact hole for exposing a source region 36 and the gate is formed by etching the interlayer dielectric film 44 by a general photolithography process.

Continuously, a thermal process is performed for planarizing the interlayer dielectric film 44. The thermal process can be performed before the process of forming the contact.

A source electrode 46 and a gate electrode 48 are formed by depositing the metal film on the overall surface of the resultant structure in which the contact hole is formed and patterning the metal film by the photolithography process. Subsequent processes are performed identically to the general MOSFET manufacturing process.

A MOSFET having an N⁺ source region was described. However, the present invention can be applied to a MOSFET having a P⁺ source region.

Figure 7:
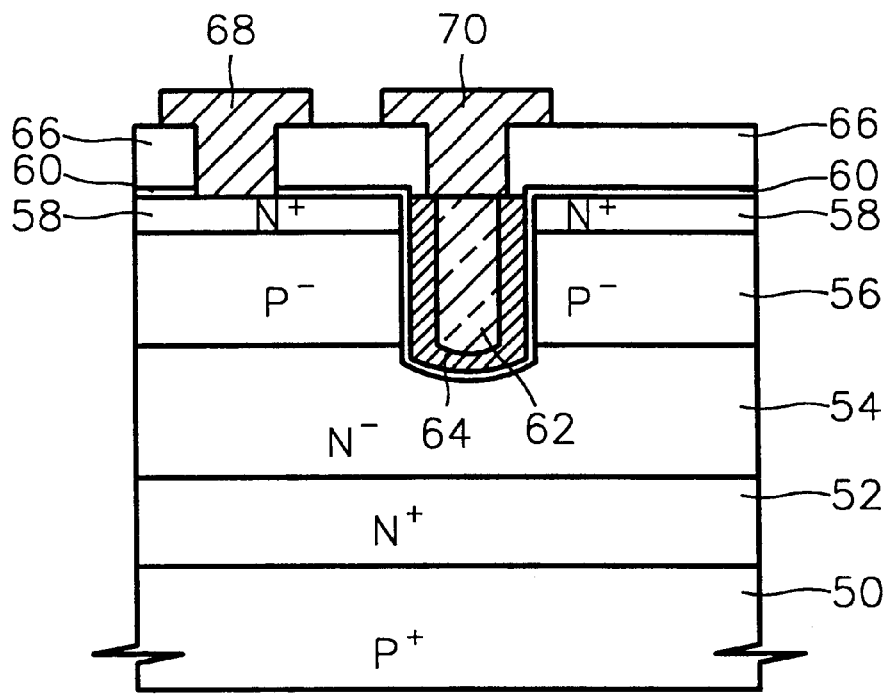
FIG. 7 is a sectional view showing a power semiconductor device of a trench gate structure according to another embodiment.

FIG. 7 is a sectional view for describing another embodiment of the present invention, which is the sectional view of an IGBT.

Reference numerals 50, 52, 54, 56, 58, 60, 62, 64, 66, 68, and 70 respectively denote a P⁺ semiconductor substrate 50, an N⁺ buffer layer 52, an N⁻ epitaxial layer 54, a P⁻ body region 56, an N⁺ source region 58, a gate insulating film 60, a polysilicon film 62 for a gate, a metal film 64 for a gate, an interlayer dielectric film 66, a source electrode 68, and a gate electrode 70.

Since the manufacturing processes and the structure of the MOSFET shown in FIG. 7 are the same as those of the MOSFET shown in FIGS. 2 and 6, except that the N⁺ buffer layer 52 is formed on the P⁺ semiconductor substrate 50 instead of the N⁺ semiconductor substrate 30 (FIG. 2), descriptions thereof will be omitted.

According to the disclosed power semiconductor device having the trench structure and the disclosed method for manufacturing the same, it is possible to directly contact the gate to the gate electrode by forming the part of the trench in which the gate contacts the gate electrode to be wide, and by filling the trench using the polysilicon film and the metal film. Therefore, it is possible to omit a mask for patterning the polysilicon film since it is not necessary to leave the polysilicon film of a certain width on the semiconductor substrate for performing the contact. It is possible to reduce the contact resistance due to the high deposition speed, the high electric conductivity, and the heat-resistance of the metal, and to prevent the characteristics of the device from deteriorating by heat processing.

What is claimed is:

1. A power semiconductor device of a trench gate structure, comprising:

a semiconductor substrate;

a semiconductor region of a first conductive type formed on the semiconductor substrate;

a source region of a second conductive type formed on the semiconductor region;

a gate formed in a trench formed to pass through the source region and the semiconductor region, said gate formed of a first conductive polysilicon layer formed to be insulated from the semiconductor substrate by interposing a gate insulating film, and formed of a second conductive metal layer surrounded by the first conductive polysilicon layer, wherein both the first conductive polysilicon layer and the second conductive metal layer extend to a depth which passes through the source region and the semiconductor region to the semiconductor substrate;

an interlayer dielectric film formed on the semiconductor substrate;

a gate electrode connected to the gate through a first contact hole formed in the interlayer dielectric film; and a source electrode connected to the source region through a second contact hole formed in the interlayer dielectric film.

2. The power semiconductor device of claim 1, where in a width of the upper surface of the gate is equal to or less than a width of a trench.

3. The power semiconductor device of claim 1, wherein the trench is circular in a plane parallel to a top surface of said semiconductor substrate.

4. The power semiconductor device of claim 1, wherein the trench has a shape of a polygon having at least five sides in a plane parallel to a top surface of said semiconductor substrate.

5. The power semiconductor device of claim 1, wherein the width of the trench in the part in which the gate contacts a gate electrode is 2 $\mu$m.

6. The power semiconductor device of claim 1, wherein the semiconductor substrate comprises:
   a first region highly doped with second conductive type impurities; and
   a second conductive region formed on the first region and doped with the second conductive type impurities of low concentration.

7. The power semiconductor device of claim 1, wherein the semiconductor substrate comprises:
   a first region highly doped with first conductive type impurities;
   a second region highly doped with second conductive type impurities; and
   a third region formed on the first region and doped with the second conductive type impurities of low concentration.

8. A power semiconductor device of a trench gate structure, comprising:
   a semiconductor substrate;
   a semiconductor region of a first conductive type formed on the semiconductor substrate;
   a source region of a second conductive type formed on the semiconductor region;
   a trench having inner walls defining an opening in the source region and extending through the semiconductor region to the semiconductor substrate;
   a gate insulating film covering the inner walls of the trench;
   a gate comprising a first conductive layer and a second conductive layer, the first conductive layer covering the gate insulating film within the trench, and the second conductive layer surrounded by the first conductive layer and extending through a center of the trench from the opening of the trench;
   a dielectric layer located over the source region and the trench, the dielectric layer having first and second openings defined therein, wherein the first opening is aligned over the second conductive layer of the gate, and wherein the first opening has a width which is greater than a width of the second conductive layer and less than a width of the trench;
   a gate electrode extending through the first opening in the dielectric layer and contacting the gate; and
   a source electrode extending through the second opening in the dielectric layer and contacting the source region.

9. The power semiconductor device of claim 8, wherein the first conductive layer is polysilicon, and the second conductive layer is metal.

* * * * *